(12) United States Patent
Zheng

(10) Patent No.: US 11,488,832 B2
(45) Date of Patent: Nov. 1, 2022

(54) METHOD AND APPARATUS FOR FINAL POLISHING OF SILICON WAFER

(71) Applicant: XUZHOU XINJING SEMICONDUCTOR TECHNOLOGY CO., LTD, Jiangsu (CN)

(72) Inventor: Jiazhen Zheng, Jiangsu (CN)

(73) Assignee: XUZHOU XINJING SEMICONDUCTOR TECHNOLOGY CO., LTD., Jiangsu (CN)

(*) Notice: Subject to any disclaimer, the term of this patent is extended or adjusted under 35 U.S.C. 154(b) by 0 days.

(21) Appl. No.: 17/264,514

(22) PCT Filed: Dec. 25, 2019

(86) PCT No.: PCT/CN2019/128276
§ 371 (c)(1),
(2) Date: Jan. 29, 2021

(87) PCT Pub. No.: WO2020/135498
PCT Pub. Date: Jul. 2, 2020

(65) Prior Publication Data
US 2021/0296133 A1 Sep. 23, 2021

(30) Foreign Application Priority Data
Dec. 29, 2018 (CN) .......................... 201811636945.7

(51) Int. Cl.
*H01L 21/306* (2006.01)
*B24B 37/04* (2012.01)

(52) U.S. Cl.
CPC ...... *H01L 21/30625* (2013.01); *B24B 37/042* (2013.01)

(58) Field of Classification Search
CPC ......... H01L 21/30625; H01L 21/02024; B24B 37/042; B24B 1/00; B24B 29/02
(Continued)

(56) References Cited

U.S. PATENT DOCUMENTS 5,571,373 A * 11/1996 Krishna ............ H01L 21/30625
438/693
5,616,212 A 4/1997 Isobe
(Continued)

FOREIGN PATENT DOCUMENTS

CN 1133904 A 10/1996
CN 1964001 A 5/2007
(Continued)

OTHER PUBLICATIONS

Translation of JP2873310B2 (application No. JP 1989-97730A) (Year: 1999).*
(Continued)

*Primary Examiner* — Duy Vu N Deo
(74) *Attorney, Agent, or Firm* — Stinson LLP

(57) ABSTRACT

Provided are a method and apparatus for final polishing of a silicon wafer. The method for final polishing includes: within a predetermined period of time remaining before completion of the final polishing, forming a hydrophilic silicon oxide film on a surface of the silicon wafer by using both a polishing slurry and an oxidizing solution as a polishing liquid.

16 Claims, 2 Drawing Sheets

(58) Field of Classification Search
USPC .................................................. 438/690–693
See application file for complete search history.

(56) References Cited

U.S. PATENT DOCUMENTS

2010/0252070 A1* 10/2010 Okuuchi ........... H01L 21/02052
  134/2
2011/0171890 A1*  7/2011 Nakayama ............... D04H 3/10
  451/526

FOREIGN PATENT DOCUMENTS

| CN | 103009222 A | 4/2013 | |
|---|---|---|---|
| CN | 105144350 A | 12/2015 | |
| CN | 105647393 A | 6/2016 | |
| CN | 106663621 A | 5/2017 | |
| CN | 108885986 A | 11/2018 | |
| CN | 109648451 A | 4/2019 | |
| JP | S63221967 A | 9/1988 | |
| JP | 2-275629 | * 4/1989 | ........... H01L 21/304 |
| JP | 2000173958 A | 6/2000 | |

OTHER PUBLICATIONS

International Search Report and Written Opinion issued PCT/CN2019/128276, dated Mar. 3, 2020.

\* cited by examiner

METHOD AND APPARATUS FOR FINAL POLISHING OF SILICON WAFER

REFERENCE TO RELATED APPLICATIONS

The present application is the 371 National Stage Application of International Patent Application Serial No. PCT/CN2019/128276, filed Dec. 25, 2019, which claims the benefit of Chinese Patent Application No. 201811636945.7 filed on Dec. 29, 2018, the entire disclosures of which are incorporated herein by reference.

BACKGROUND

Technical Field

The present invention belongs to the field of silicon wafer polishing. Specifically, the present invention relates to a method and apparatus for final polishing of a silicon wafer.

Related Art

A number of surface defects of semiconductor-grade silicon wafers is a key parameter for chip manufacturing. In a manufacturing process for the semiconductor-grade silicon wafer, two-sided polishing and final polishing are generally performed. The silicon wafer polishing process is to grind the silicon wafer with a polishing cloth, a polishing slurry, and alkaline chemicals. Damages and defects on a surface of the silicon wafer are removed at a specific pressure and rotating speed, so as to achieve flatness of a specific level and a number of surface defects. In addition, a polishing cloth (or a polishing pad) is required during the polishing. Generally, a break-in time is required between a new polishing cloth and a dummy wafer (which is mainly used for grinding-in of a wafer of a machine) before use. The process is referred to as a polishing pad break-in time. The polishing pad break-in time is generally more than a plurality of hours or longer, and a large number of dummy wafers and polishing slurries are required in the process.

In an existing polishing process for the semiconductor-grade silicon wafer, after polishing is completed, special polymer materials (such as cellulose or interfacial activators) are to be added to form a hydrophobic protective film or a hydrophilic protective film to cover a surface of the silicon wafer, thereby preventing particles in the polishing slurry from adhering to the surface of the silicon wafer. The hydrophobic protective film is not easily removed through cleaning, and therefore is currently infrequently adopted in a polishing process for large-size semiconductor-grade silicon wafers. Alternatively, a hydrophilic protective film is formed on the surface of the silicon wafer after the silicon wafer is polished. However, in an actual process, if the polishing cloth break-in time is insufficient, many particles exist on the surface of the silicon wafer, or after the polishing is completed, the surface of the hydrophobic silicon wafer is dried when removed from a polishing machine, so that particles existing on the surface are firmly adsorbed on the silicon wafer surface, which are difficult to remove in a next cleaning process. In addition, the hydrophilic protective film formed according to the method cannot reduce the polishing pad break-in time, and the wafer still needs a polishing pad break-in time of more than a few hours or longer, resulting in a large amount of production loss and cost increase.

SUMMARY

The present invention aims to solve one of the technical problems in the related art at least to a certain extent. To this end, an objective of the present invention is to provide a method and apparatus for final polishing of a silicon wafer. By adopting the method and apparatus for final polishing, a hydrophilic protective film can be effectively formed on a surface of the silicon wafer, thereby effectively maintaining the surface of the silicon wafer wet. In addition, a long break-in time is reduced, significantly improving processing efficiency and reducing costs.

According to an aspect of the present invention, the present invention provides a method for final polishing of a silicon wafer. According to an embodiment of the present invention, the method for final polishing of a silicon wafer includes: within a predetermined period of time remaining before completion of the final polishing, forming a hydrophilic silicon oxide film on a surface of the silicon wafer by using both a polishing slurry and an oxidizing solution as a polishing liquid.

Therefore, in the present invention, in a final stage before completion of the final polishing of the silicon wafer, both the polishing slurry and the oxidizing solution are used as the polishing liquid, so that the hydrophilic silicon oxide film is formed on the surface of the silicon wafer. In the final polishing stage, by adding both the polishing slurry and the oxidizing solution, the oxide film can be formed when particles of the polishing slurry are removed from the surface of the silicon wafer. During the formation of the hydrophilic silicon oxide film, not only the long polishing cloth break-in time can be reduced, but also the surface of the silicon wafer can be effectively maintained wet, which avoids surface pollution as a result of drying of the surface of the silicon wafer, thus reducing a cleaning time of a next process, and significantly improving production efficiency and reducing costs.

In addition, the method for final polishing of a silicon wafer according to the above embodiment of the present invention may further have the following additional technical features.

In some embodiments of the present invention, the predetermined period of time is from 10 seconds to 30 seconds.

In some embodiments of the present invention, the oxidizing solution is a hydrogen peroxide solution or ozonated water.

In some embodiments of the present invention, a concentration of the hydrogen peroxide solution is from 1% by weight (wt %) to 10 wt %.

In some embodiments of the present invention, a concentration of the ozonated water is from 1 ppm to 20 ppm (mg/L).

In some embodiments of the present invention, a flow rate of the oxidizing solution is from 500 ml/min to 3000 ml/min.

In some embodiments of the present invention, a rotational speed for the polishing and a pressure for the polishing are reduced during the polishing by using both the polishing slurry and the oxidizing solution as the polishing liquid.

In some embodiments of the present invention, the rotational speed for the polishing is reduced to from 1 rpm to 10 rpm, and the pressure for the polishing is reduced to be not greater than 30 g/cm$^2$.

In some embodiments of the present invention, a thickness of the hydrophilic silicon oxide film is from 1 Å to 10 Å.

According to a second aspect of the present invention, the present invention further provides an apparatus for final polishing of a silicon wafer. According to the embodiment of the present invention, the apparatus for final polishing of a silicon wafer includes:

a rotating platform, a polishing cloth being attached to the rotating platform (the rotating platform is a polishing platform);

at least one polishing head telescopically disposed above the rotating platform, where the silicon wafer is fixed to a bottom surface of the polishing head through wax or a buffer pad, and the polishing head rotates to drive the silicon wafer into rotation and friction against the polishing cloth for polishing;

a polishing slurry delivery pipe, where an outlet of the polishing slurry delivery pipe is disposed above the rotating platform and is adapted to deliver a polishing slurry to the polishing cloth;

an oxidizing solution delivery pipe, where an outlet of the oxidizing solution delivery pipe is disposed above the rotating platform and is adapted to deliver an oxidizing solution to the polishing cloth;

a first valve and a first flowmeter, where the first valve and the first flowmeter are disposed on the polishing slurry delivery pipe; and a second valve and a second flowmeter, where the second valve and the second flowmeter are disposed on the oxidizing solution delivery pipe.

DETAILED DESCRIPTION

Figure 1:
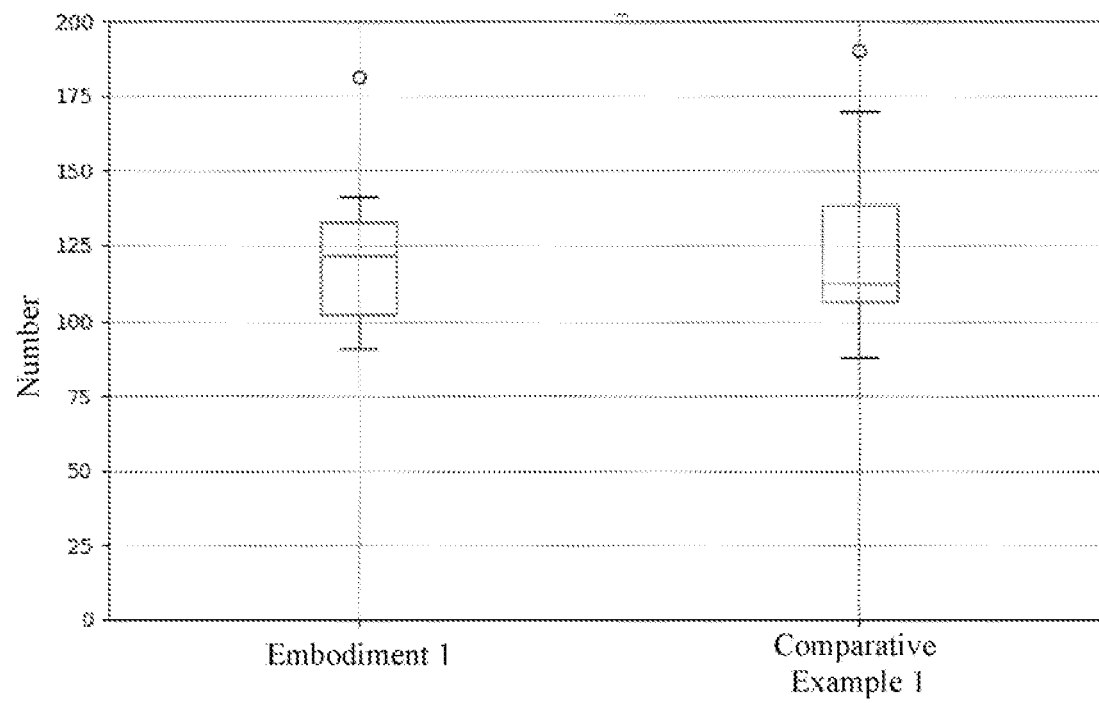
FIG. 1 is a comparison box diagram of a 19 nm-LLS of Embodiment 1 and Comparative Example 1.

The following describes embodiments of the present invention in detail. The embodiments described below are exemplary, and are intended to explain the present invention and cannot be construed as a limitation to the present invention.

According to an aspect of the present invention, the present invention provides a method for final polishing of a silicon wafer. According to an embodiment of the present invention, the method for final polishing of a silicon wafer includes: within a predetermined period of time remaining before completion of the final polishing, forming a hydrophilic silicon oxide film on a surface of the silicon wafer by using both a polishing slurry and an oxidizing solution as a polishing liquid.

In the present invention, in the final polishing stage, both the polishing slurry and the oxidizing solution are added for not only polishing but also growing an oxide film, so that not only a polishing cloth break-in time can be reduced, but also no residual polishing slurry particles remain on a formed oxide film, which can effectively maintain a surface of the silicon wafer wet, thus avoiding surface pollution as a result of drying of the surface of the silicon wafer, reducing a cleaning time of a next process, and significantly improving production efficiency and reducing costs.

According to a specific embodiment of the present invention, within a predetermined period of time remaining before completion of the final polishing, both the polishing slurry and the oxidizing solution are used as the polishing liquid. The predetermined period of time may be from 10 seconds to 30 seconds. According to the specific embodiment of the present invention, the predetermined period of time may be 10 seconds, 12 seconds, 14 seconds, 16 seconds, 18 seconds, 20 seconds, 22 seconds, 24 seconds, 26 seconds, 28 seconds, or 30 seconds. Therefore, within 10 seconds to 30 seconds of the final stage of the final polishing, both the polishing slurry and the oxidizing solution are used as the polishing liquid, so that the surface of the silicon wafer can be effectively oxidized to form the hydrophilic silicon oxide film. The inventor found that an excessively long predetermined period of time leads to an increased haze value of the surface of silicon wafer, and an excessively short predetermined period of time leads to a failure of forming the oxide film.

According to another specific embodiment of the present invention, the oxidizing solution used together with the polishing slurry may be a hydrogen peroxide solution or ozonated water. Since the hydrogen peroxide solution or the ozonated water is weakly acidic, a part of alkaline composition in the polishing slurry can be neutralized. Therefore, the hydrogen peroxide solution or the ozonated water is adopted in such an effective way that not only the hydrophilic silicon oxide film can be formed on the surface of the silicon wafer, but also the polishing slurry can be prevented from continuously slightly corroding the surface of the silicon wafer after completion of the polishing.

According to the specific embodiment of the present invention, a concentration of the above used hydrogen peroxide solution may be from 1% by weight to 10% by weight. According to the specific embodiment of the present invention, the concentration of the hydrogen peroxide solution may be 1% by weight, 2% by weight, 3% by weight, 4% by weight, 5% by weight, 6% by weight, 7% by weight, 8% by weight, 9% by weight, or 10% by weight. Generally, the concentration is in direct proportion to a formation rate of the oxide film, but the inventor found that an excessively high concentration may further affect or reduce a haze characteristic (a haze value increases) of the surface of the silicon wafer and that an excessively low concentration results in a failure of growing the oxide film. Haze is defined herein as a defect. The haze is measured in ppm, which is a ratio of an average surface scattering intensity to an intensity of an incident laser beam.

According to the specific embodiment of the present invention, a mass concentration of the ozonated water may be from 1 ppm to 20 ppm. According to the specific embodiment of the present invention, the mass concentration of the ozonated water may be 1 ppm, 2 ppm, 3 ppm, 4 ppm, 5 ppm, 6 ppm, 7 ppm, 8 ppm, 9 ppm, 10 ppm, 11 ppm, 12 ppm, 13 ppm, 14 ppm, 15 ppm, 16 ppm, 17 ppm, 18 ppm, 19 ppm, or 20 ppm. Generally, the concentration is in direct proportion to the formation rate of the oxide film, but the inventor found that an excessively high concentration may further affect or reduce a haze or LLS characteristic of the surface of the silicon wafer and that an excessively low concentration results in a failure of growing the oxide film. Haze is defined herein as a defect. A localized light scatterer (LLS), which is generally referred to as a localized light scattering defect, is a surface defect including etch pits, scratches, primary defects, particles, and the like.

According to the specific embodiment of the present invention, when both the polishing slurry and the oxidizing solution are used as the polishing liquid, a flow rate of the oxidizing solution is from 500 ml/min to 3000 ml/min. According to the specific embodiment of the present invention, the flow rate of the oxidizing solution may be 500 ml/min, 600 ml/min, 700 ml/min, 800 ml/min, 900 ml/min, 1000 ml/min, 1100 ml/min, 1200 ml/min, 1300 ml/min, 1400 ml/min, 1500 ml/min, 1600 ml/min, 1700 ml/min, 1800 ml/min, 1900 ml/min, 2000 ml/min, 2100 ml/min, 2200 ml/min, 2300 ml/min, 2400 ml/min, 2500 ml/min, 2600 ml/min, 2700 ml/min, 2800 ml/min, 2900 ml/min, or 3000 ml/min. The inventor found that the flow rate affects uniformity of the formed silicon oxide film. Therefore, a proper amount of oxidizing solution may be provided to the silicon wafer during the polishing, so that the surface of the silicon wafer is properly oxidized to form a silicon oxide film.

According to the specific embodiment of the present invention, a ratio of a flow rate of the polishing slurry to the flow rate of the oxidizing solution is from about 1:1 to about 1:5, the flow rate of the oxidizing solution is in direct proportion to the formation rate of the oxide film, and a high flow rate of the oxidizing solution facilitates formation of an oxide film with a relatively uniform thickness. Preferably, the ratio of the flow rate of the polishing slurry to the flow rate of the oxidizing solution is from 1:2 to 1:3. The inventor found that when the flow rate of the oxidizing solution is slightly greater than the flow rate of the polishing slurry, a growth rate of the oxide film may be greater than a removal rate, ensuring effective formation of a uniform silicon oxide film.

According to a specific embodiment of the present invention, the method for final polishing of a silicon wafer includes: within the remaining 10 seconds to 30 seconds before completion of the final polishing, forming the hydrophilic silicon oxide film on the surface of the silicon wafer by using both the polishing slurry and a hydrogen peroxide solution with a concentration of 1-10% by weight or ozonated water with a mass concentration of 1-20 ppm as the polishing liquid. A flow rate of the hydrogen peroxide solution or the ozonated water is from 500 ml/min to 3000 ml/min. Therefore, in the present invention, the above preferred method for final polishing is obtained by screening a use time of the oxidizing solution, a specific oxidizing solution type, and a flow rate during use. The inventor found that, by selecting the proper oxidizing solution and an inlet flow rate during use and adding the oxidizing solution at a proper time, not only the silicon oxide film can be effectively obtained, but also a degree of oxidation on the surface of the silicon wafer can be further controlled, thereby obtaining a silicon oxide film with a proper thickness. Specifically, through controlled release of the above preferred parameters, a silicon oxide film, that is, a hydrophilic protective layer, with a thickness of 1-10 Å (angstroms) can be formed on the surface of the silicon wafer, which can effectively prevent surface pollutants from adhering to the surface of the silicon wafer.

According to the method for final polishing in the above embodiment of the present invention, since both the polishing slurry and the oxidizing solution are used in the final stage of the final polishing, the inventor realized that the method may be used to form a non-uniform silicon oxide film. Therefore, a rotational speed for the polishing and a pressure for the polishing are reduced during the polishing by using both the polishing slurry and the oxidizing solution as the polishing liquid. In this way, a removal rate of non-uniform polishing on the silicon wafer can be effectively reduced, thereby forming a uniform silicon oxide film to cover the silicon wafer.

According to the specific embodiment of the present invention, in the above embodiment, the rotational speed for the polishing may be reduced to from 1 rpm to 10 rpm, and the pressure for the polishing may be reduced to be not greater than 30 g/cm$^2$. Therefore, a proper polishing removal rate may be controlled to generate a uniform silicon oxide film. According to the specific embodiment of the present invention, the rotational speed for the polishing may be reduced to 1 rpm, 2 rpm, 3 rpm, 4 rpm, 5 rpm, 6 rpm, 7 rpm, 8 rpm, 9 rpm, or 10 rpm. The pressure for the polishing may be reduced to 1 g/cm$^2$, 5 g/cm$^2$, 10 g/cm$^2$, 15 g/cm$^2$, 20 g/cm$^2$, 25 g/cm$^2$, or 30 g/cm$^2$.

According to the method for final polishing in the embodiment of the present invention, a uniform silicon oxide film with a thickness of 1-10 Å can be formed on the surface of the silicon wafer to achieve good physical hydrophilicity. In addition, a long polishing pad break-in time of the polishing cloth can be reduced, and defects on the surface of the polished wafer can reach a current process level.

According to a second aspect of the present invention, the present invention further provides an apparatus for final polishing of a silicon wafer. According to a specific embodiment of the present invention, the apparatus for final polishing includes:

a rotating platform 10, where a polishing cloth 11 is attached to the rotating platform 10 (the rotating platform is a polishing platform);

at least one polishing head 20, where the polishing head 20 is telescopically disposed above the rotating platform 10, the silicon wafer 21 is fixed to a bottom surface of the polishing head 20 through wax or a buffer pad, and the polishing head 20 rotates to drive the silicon wafer 21 into rotation and friction against the polishing cloth 11 for polishing in the presence of the polishing slurry;

a polishing slurry delivery pipe 30, where an outlet of the polishing slurry delivery pipe is disposed above the rotating platform and is adapted to deliver the polishing slurry to the polishing cloth;

an oxidizing solution delivery pipe 40, where an outlet of the oxidizing solution delivery pipe is disposed above the rotating platform and is adapted to deliver an oxidizing solution to the polishing cloth;

a first valve 50 and a first flowmeter 60, where the first valve 50 and the first flowmeter 60 are disposed on the polishing slurry delivery pipe 30; and a second valve 70 and a second flowmeter 80, where the second valve 70 and the second flowmeter 80 are disposed on the oxidizing solution delivery pipe 40.

Therefore, the apparatus for final polishing of a silicon wafer in the above embodiment of the present invention can be used to effectively perform final polishing on the silicon wafer. In particular, in the final stage of the final polishing of the silicon wafer, the first valve 50 of the polishing slurry delivery pipe 30 and the second valve 70 of the oxidizing solution delivery pipe 40 may be simultaneously turned on, and both the polishing slurry and the oxidizing solution are used as the polishing liquid. However, by adding the oxidizing solution, pure silicon on the surface of the silicon wafer may be oxidized to form a silicon oxide, the long polishing pad break-in time of the polishing cloth can be reduced, and the defects on the surface of the polished wafer can reach the current process level.

According to the specific embodiment of the present invention, by disposing the first valve 50 on the polishing slurry delivery pipe 30 and the second valve 70 on the oxidizing solution delivery pipe 40, a period of time spent in adding the polishing slurry and the oxidizing solution can be effectively controlled. Specifically, when the final polishing starts, the first valve 50 is first turned on to use the polishing slurry alone as a polishing agent, and within 10 seconds to 30 seconds remaining before completion of the final polishing, the second valve 70 is turned on to use both the polishing slurry and the oxidizing solution as the polishing agent. In this way, a hydrophilic silicon oxide film can be effectively formed on the surface of the silicon wafer. The hydrophilic silicon oxide film can effectively maintain the surface of the silicon wafer wet before cleaning to prevent the surface of the silicon wafer from drying. In addition, the long polishing cloth break-in time can be effectively reduced, which significantly improves processing efficiency and reduces costs.

According to the specific embodiment of the present invention, by disposing the first flowmeter 60 on the polishing slurry delivery pipe 30 and the second flowmeter 80 on the oxidizing solution delivery pipe 40, flow rates of the added polishing slurry and oxidizing solution can be effectively controlled. Specifically, the flow rate of the polishing slurry may be controlled to be from 300 ml/min to 1000 ml/min by using the first flowmeter 60. The flow rate of the oxidizing solution may be controlled to be from 500 ml/min to 3000 ml/min by using the second flowmeter 80. Therefore, a proper amount of oxidizing solution may be provided to the silicon wafer during the polishing, so that the surface of the silicon wafer is properly oxidized to form a silicon oxide film.

Embodiment 1 (1.5% by Weight of a Hydrogen Peroxide Solution)

Final polishing is performed on a silicon wafer. The silicon wafer to be processed is a double-sided polished wafer.

Within 20 seconds remaining before completion of the final polishing, both a polishing slurry and a hydrogen peroxide solution with a concentration of 1.5% by weight are used as the polishing liquid. A flow rate of the polishing slurry is 700 ml/min. A flow rate of the hydrogen peroxide solution is 1500 ml/min. A rotational speed for the polishing is 5 rpm, and a pressure for the polishing is 15 $g/cm^2$. After completion of the final polishing, a hydrophilic silicon oxide film is formed on a surface of the silicon wafer.

The polishing cloth break-in time used at this point is 50 min.

Embodiment 2 (5% by Weight of Hydrogen Peroxide)

Final polishing is performed on a silicon wafer. The silicon wafer is the same as that in Embodiment 1.

Within 20 seconds remaining before completion of the final polishing, both a polishing slurry and a hydrogen peroxide solution with a concentration of 5% by weight are used as a polishing liquid. A flow rate of the polishing slurry is 700 ml/min. A flow rate of the hydrogen peroxide solution is 1500 ml/min. A rotational speed for the polishing is 5 rpm, and a pressure for the polishing is 15 $g/cm^2$. After completion of the final polishing, a hydrophilic silicon oxide film is formed on a surface of the silicon wafer.

The polishing cloth break-in time used at this point is 100 min.

Embodiment 3 (10% by Weight of a Hydrogen Peroxide Solution)

Final polishing is performed on a silicon wafer. The silicon wafer is the same as that in Embodiment 1.

Within 20 seconds remaining before completion of the final polishing, both a polishing slurry and a hydrogen peroxide solution with a concentration of 10% by weight are used as a polishing liquid. A flow rate of the polishing slurry is 700 ml/min. A flow rate of the hydrogen peroxide solution is 1500 ml/min, a rotational speed for the polishing is 5 rpm, and a pressure for the polishing is 15 $g/cm^2$. After completion of the final polishing, a hydrophilic silicon oxide film is formed on a surface of the silicon wafer.

The polishing cloth break-in time used at this point is 50 min.

Embodiment 4 (10 ppm of Ozonated Water)

Final polishing is performed on a silicon wafer. The silicon wafer is the same as that in Embodiment 1.

Within 20 seconds remaining before completion of the final polishing, both a polishing slurry and ozonated water with a concentration of 10 ppm are used as a polishing liquid. A flow rate of the polishing slurry is 700 ml/min. A flow rate of the ozonated water is 1500 ml/min, a rotational speed for the polishing is 5 rpm, and a pressure for the polishing is 15 $g/cm^2$. After completion of the final polishing, a hydrophilic silicon oxide film is formed on a surface of the silicon wafer. The polishing pad break-in time used at this point is 50 min.

Comparative Example 1 (a Polishing Slurry Alone)

Final polishing is performed on a silicon wafer. The silicon wafer is the same as that in Embodiment 1.

Within 20 seconds remaining before completion of the final polishing, only the polishing slurry is used as a polishing liquid. A flow rate of the polishing slurry is 700 ml/min. A rotational speed for the polishing is 55 rpm, and a pressure for the polishing is 35 $g/cm^2$.

The polishing cloth break-in time used at this point is generally 200 min in the prior art.

Comparative Example 2 (20% by Weight of a Hydrogen Peroxide Solution)

Final polishing is performed on a silicon wafer. The silicon wafer is the same as that in Embodiment 1.

Within 20 seconds remaining before completion of the final polishing, both a polishing slurry and a hydrogen peroxide solution with a concentration of 20% by weight are used as a polishing liquid. A flow rate of the polishing slurry is 700 ml/min. A flow rate of the hydrogen peroxide solution is 1500 ml/min, a rotational speed for the polishing is 5 rpm, and a pressure for the polishing is 15 $g/cm^2$. After completion of the final polishing, a hydrophilic silicon oxide film is formed on a surface of the silicon wafer.

The polishing cloth break-in time used at this point is 50 min.

Test: Defects on the surfaces of the silicon wafers after the final polishing in Embodiments 1-4 and Comparative Examples 1-2 are respectively characterized by using a KLA-Tencor SP5 device for detection. Results are shown in FIG. 1 to FIG. 3.

CONCLUSIONS

It can be seen from FIG. 1 that, when Embodiment 1 is compared with Comparative Example 1, although the polishing cloth break-in time is merely 50 minutes in Embodiment 1, with the addition of both the polishing slurry and the oxidizing solution, a number of LLS defects is approximately equivalent to that in the prior art, and is reduced as compared with that in Comparative Example 1.

Figure 2:
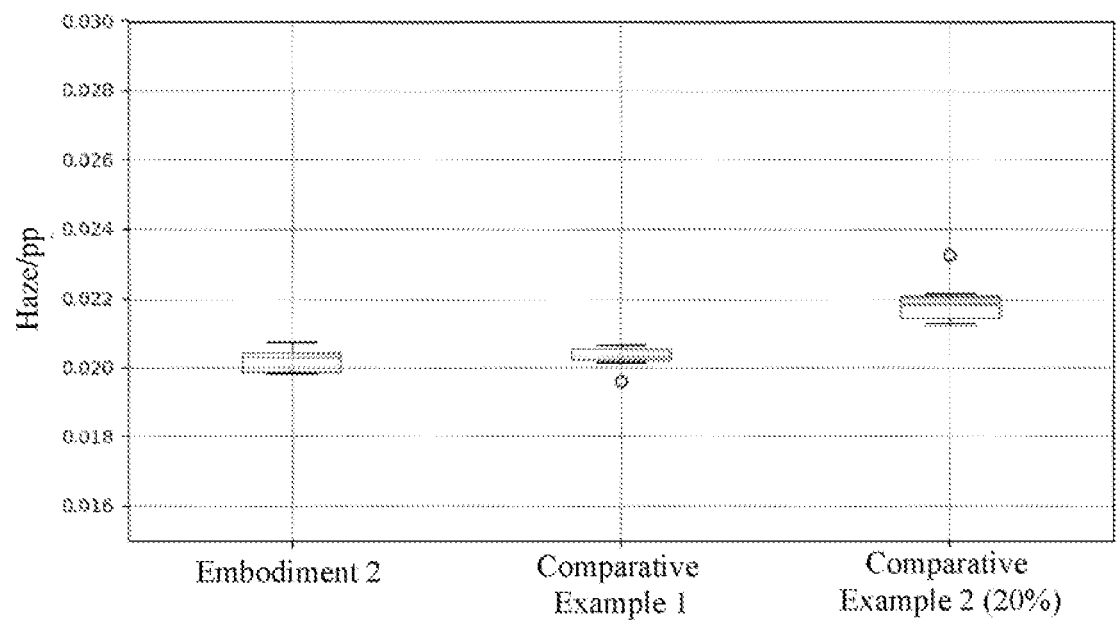
FIG. 2 is a comparison box diagram of a haze of Embodiment 2 and Comparative Examples 1 and 2.
Figure 3:
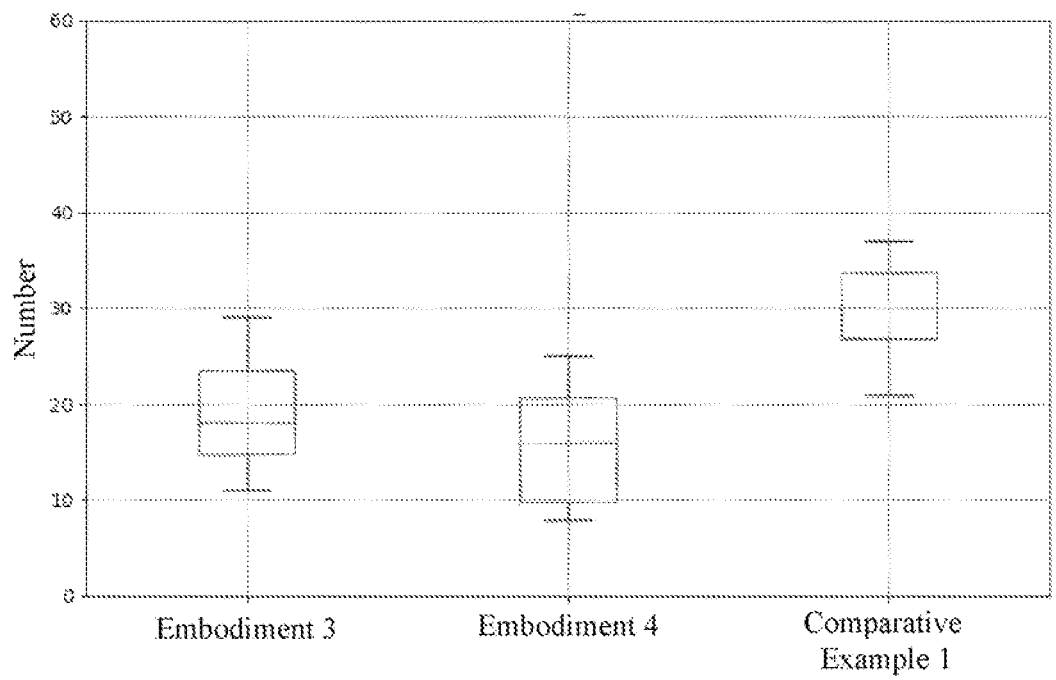
FIG. 3 is a comparison box diagram of a 26 nm-LLS of Embodiments 3 and 4 and Comparative Example 1.
Figure 4:
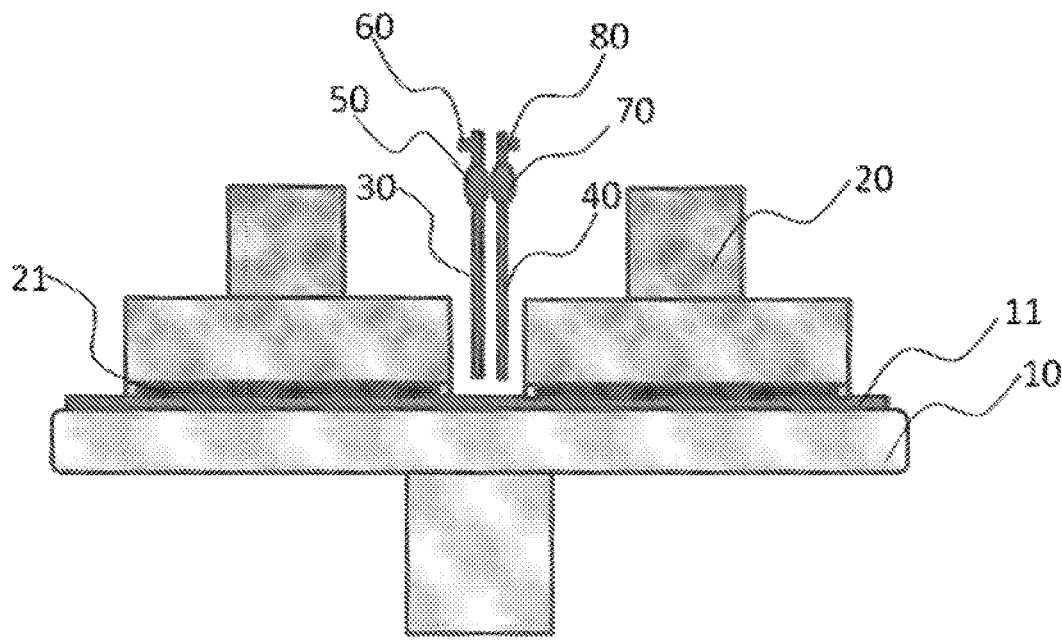
FIG. 4 is a schematic structural diagram of an apparatus for final polishing of a silicon wafer according to an embodiment of the present invention.

Similarly, referring to FIG. 2, when Embodiment 2 is compared with Comparative Example 1, despite a shorter polishing cloth break-in time, haze defects are approximately equivalent to those in the prior art in Comparative Example 1. However, if the high-concentration oxidizing solution in Comparative Example 2 is adopted, excessive haze defects occur. Referring to FIG. 3, when Embodiments 3 and 4 are compared with Comparative Example 1, despite a shorter polishing cloth break-in time, a number of LLS defects is greatly reduced as compared with that in the prior art in Comparative Example 1.

In description of the present disclosure, description of reference terms such as "one embodiment", "some embodiments", "example", "specific example" or "some examples" means including specific features, structures, materials, or features described in the embodiment or example in at least one embodiment or example of the present invention. In this specification, schematic descriptions of the foregoing terms are not necessarily directed at the same embodiment or example. In addition, the described specific features, structures, materials, or characteristics can be combined in a proper manner in any one or more embodiments or examples. In addition, with no conflict, a person skilled in the art can integrate and combine different embodiments or examples and features of the different embodiments and examples described in this specification.

Although the embodiments of the present invention have been shown and described above, it may be understood that the above embodiments are exemplary and should not be construed as a limitation on the present invention, and a person skilled in the art may make changes, modifications, replacements and variations to the above embodiments within the scope of the present invention.

What is claimed is:

1. A method for final polishing of a silicon wafer, the method comprising: within a predetermined period of time remaining before completion of the final polishing, forming a hydrophilic silicon oxide film on a surface of the silicon wafer by delivering both a polishing slurry and an oxidizing solution to the surface of the silicon wafer; wherein the ratio of the flow rate of the polishing slurry to the flow rate of the oxidizing solution is from 1:1 to 1:5.

2. The method for final polishing according to claim 1, wherein the predetermined period of time is from 10 seconds to 30 seconds.

3. The method for final polishing according to claim 2, wherein a thickness of the hydrophilic silicon oxide film is from 1 Å to 10 Å.

4. The method for final polishing according to claim 1, wherein the oxidizing solution is a hydrogen peroxide solution or ozonated water.

5. The method for final polishing according to claim 4, wherein a concentration of the hydrogen peroxide solution is from 1% by weight to 10% by weight or a mass concentration of the ozonated water is from 1 ppm to 20 ppm.

6. The method for final polishing according to claim 5, wherein a thickness of the hydrophilic silicon oxide film is from 1 Å to 10 Å.

7. The method for final polishing according to claim 4, wherein a thickness of the hydrophilic silicon oxide film is from 1 Å to 10 Å.

8. The method for final polishing according to claim 1, wherein a flow rate of the oxidizing solution is from 500 ml/min to 3000 ml/min.

9. The method for final polishing according to claim 8, wherein a thickness of the hydrophilic silicon oxide film is from 1 Å to 10 Å.

10. The method for final polishing according to claim 1, wherein a thickness of the hydrophilic silicon oxide film is from 1 Å to 10 Å.

11. A method for final polishing of a silicon wafer, the method comprising: within a predetermined period of time remaining before completion of the final polishing, forming a hydrophilic silicon oxide film on a surface of the silicon wafer by using both a polishing slurry and an oxidizing solution; wherein the rotational speed for the polishing is reduced to 1 rpm to 10 rpm; and the pressure for the polishing is not treater than 30 g/cm$^2$.

12. The method for final polishing according to claim 11, wherein a thickness of the hydrophilic silicon oxide film is from 1 Å to 10 Å.

13. The method for final polishing according to claim 11, wherein the predetermined period of time is from 10 seconds to 30 seconds.

14. The method for final polishing according to claim 11, wherein the oxidizing solution is a hydrogen peroxide solution or ozonated water.

15. The method for final polishing according to claim 14, wherein a concentration of the hydrogen peroxide solution is from 1% by weight to 10% by weight or a mass concentration of the ozonated water is from 1 ppm to 20 ppm.

16. The method for final polishing according to claim 11, wherein a flow rate of the oxidizing solution is from 500 ml/min to 3000 ml/min.

* * * * *